United States Patent [19]

Ichihara

[11] Patent Number: 5,841,320
[45] Date of Patent: Nov. 24, 1998

[54] VARIABLE GAIN AMPLIFYING DEVICE

[75] Inventor: Masaki Ichihara, Tokyo, Japan

[73] Assignee: NEC Corporation, Tokyo, Japan

[21] Appl. No.: 744,369

[22] Filed: Nov. 7, 1996

[30] Foreign Application Priority Data

Nov. 7, 1995 [JP] Japan ................................ 7-288389

[51] Int. Cl.$^6$ .................................................. H03G 3/30
[52] U.S. Cl. ...................... 330/133; 330/134; 330/279
[58] Field of Search .................................. 330/129, 133, 330/134, 135, 278, 279, 138, 280; 455/241.1, 242.2, 251.1

[56] References Cited

U.S. PATENT DOCUMENTS

| | | | |
|---|---|---|---|
| 3,454,721 | 7/1969 | Wolff | 455/251.1 X |
| 3,740,471 | 6/1973 | Wilcox | 330/280 X |
| 4,223,274 | 9/1980 | Paulke et al. | 330/133 |
| 5,099,204 | 3/1992 | Wheatley, III | 330/279 |
| 5,160,898 | 11/1992 | Black | 330/284 |
| 5,410,275 | 4/1995 | Black | 330/288 |
| 5,432,473 | 7/1995 | Mattila et al. | 330/133 |

FOREIGN PATENT DOCUMENTS

| | | |
|---|---|---|
| 49-95608 | 9/1974 | Japan . |
| 57-147309 | 9/1982 | Japan . |
| 58-46709 | 3/1983 | Japan . |
| 5175764 | 7/1993 | Japan . |
| 5275946 | 10/1993 | Japan . |

*Primary Examiner*—James B. Mullins
*Attorney, Agent, or Firm*—Ostrolenk, Faber, Gerb & Soffen, LLP

[57] ABSTRACT

A variable gain amplifying device for an AGC (Automatic Gain Control) circuit included in a receiver and having a broad dynamic range is disclosed. The device has a more linear gain-to-control voltage characteristic than the conventional device. Because the device broadens the range of control voltage without aggravating the deviation of the gain, its gain-to-control voltage characteristic is more stable than the characteristic of the conventional device.

6 Claims, 5 Drawing Sheets

VARIABLE GAIN AMPLIFYING DEVICE

BACKGROUND OF THE INVENTION

The present invention relates to a variable gain amplifying device for an AGC (Automatic Gain Control) circuit included in a receiver for radio communication and having a broad dynamic range.

The problem with a receiver for mobile communication is that the strength of received electromagnetic wave varies over a broad range. In light of this, the receiver usually includes an AGC circuit. A variable gain amplifier is built in the AGC circuit without exception, and has its gain varied by a control voltage. This kind of amplifier is taught in, e.g., Japanese Patent Laid-Open Publication No. 57-147309. The amplifier taught in this document is simply used to maintain the amplitude of a received signal constant. With this kind of configuration, it is not always necessary that the control voltage and gain (dB) be linearly related to each other.

On the other hand, the prerequisite with handy phones based on, e.g., the North American IS95 CDMA system is that the strength of a received signal be measured in terms of dB by use of an AGC control voltage. To meet this prerequisite, a variable gain amplifier in which a control voltage and a gain (dB) are related as linearly as possible is desirable.

Typical of conventional variable gain amplifiers is implemented by a dual gate MOS FET (Metal Oxide Semiconductor Field Effect Transistor). An input signal is applied to a first gate of the FET via an impedance matching circuit. The amplified signal is fed out from the FET via a matching circuit. A DC control voltage is applied to a second gate of the FET in order to determine the gain of the FET. However, in this type of amplifier, the range in which the gain and control voltage are linearly related is extremely narrow. Therefore, it is difficult to implement a linear control characteristic over a broad range of the gain with a single amplifier having such a configuration.

To solve the above problem, a plurality of amplifiers sharing a single control terminal may be connected in series so as to broaden the variable range of the gain. Although this kind of scheme broadens the variable range of the gain, it enlarges the deviation from linearity at the same time. Moreover, the control voltage is variable only over a narrow range and is apt to deviate easily due to, e.g., the deviation of a circuit constant.

SUMMARY OF THE INVENTION

It is therefore an object of the present invention to provide a variable gain amplifying device capable of eliminating the problems particular to the conventional devices.

A variable gain amplifying device of the present invention includes M (M =2, 3, 4, . . . ) variable gain amplifiers connected in series. A control signal generator DC amplifies a single first control signal for gain control input thereto, shifts the amplified control signal by each predetermined value to produce shifted voltages, and limits the shifted voltages to produce limited voltages to thereby output M second control signals. The M second control signals control the gains of the M variable gain amplifiers, respectively.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

To better understand the present invention, a brief reference will be made to a conventional variable gain amplifier, shown in FIG. 1. As shown, the amplifier is implemented by a dual gate MOS FET 9. An input signal Vin is applied to a first gate 10 of the SFET 9 via an impedance matching circuit 7. The amplified signal is fed out from the FET 9 via a matching circuit 8 as an output signal Vout. A DC control voltage Vc is applied to a second gate 11 of the FET 9 in order to determine the gain of the FET 9. There are also shown in FIG. 1 resistors R1 and R2, capacitors C1 and C2, and windings L1 and L2.

Figure 2:
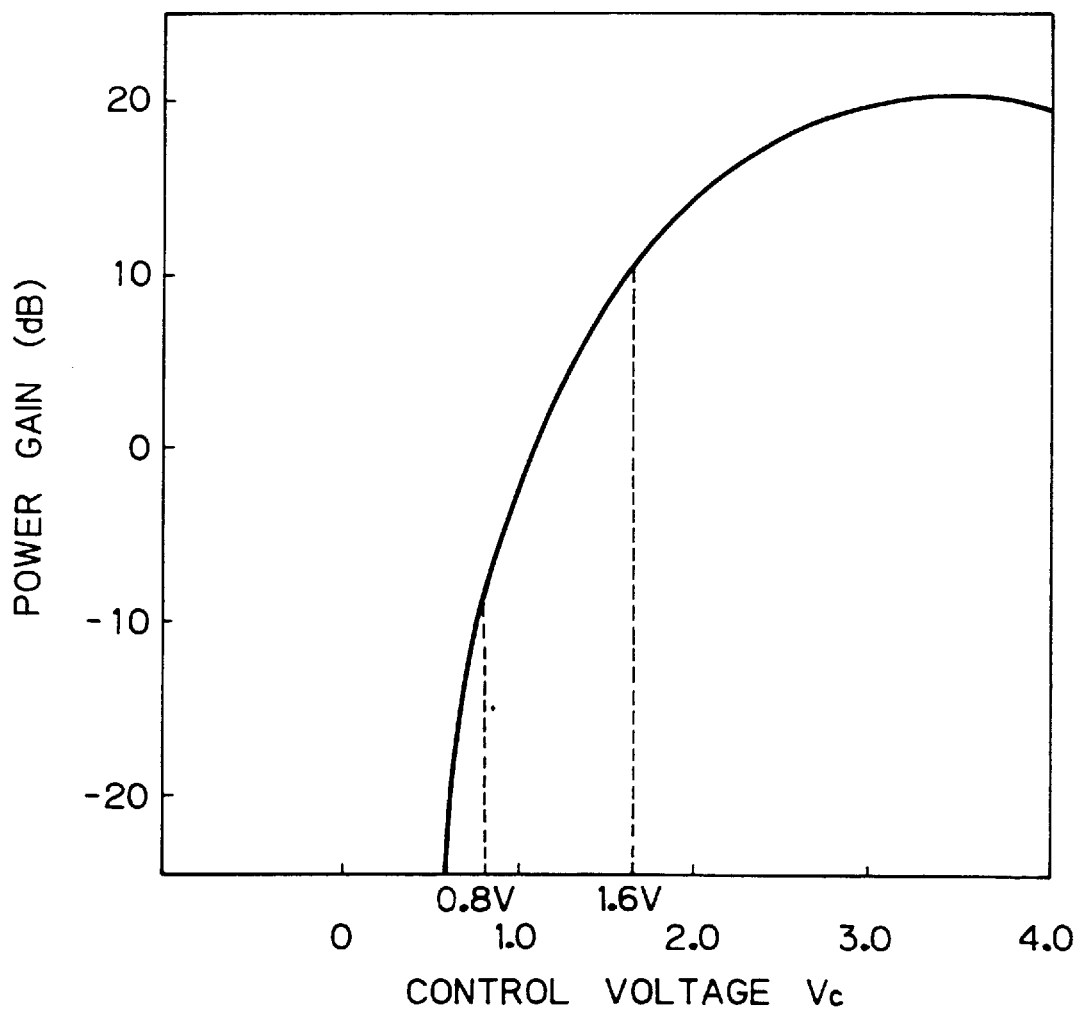
FIG. 2 is a graph showing a relation between the power gain and the control voltage of the conventional amplifier.

FIG. 2 shows a relation between the control voltage Vc and the power gain. As shown, the range in which the gain and control voltage Vc are linearly related is extremely narrow. Therefore, it is difficult to implement a linear control characteristic over a broad range of the gain with a single amplifier having the above configuration.

Figure 1:
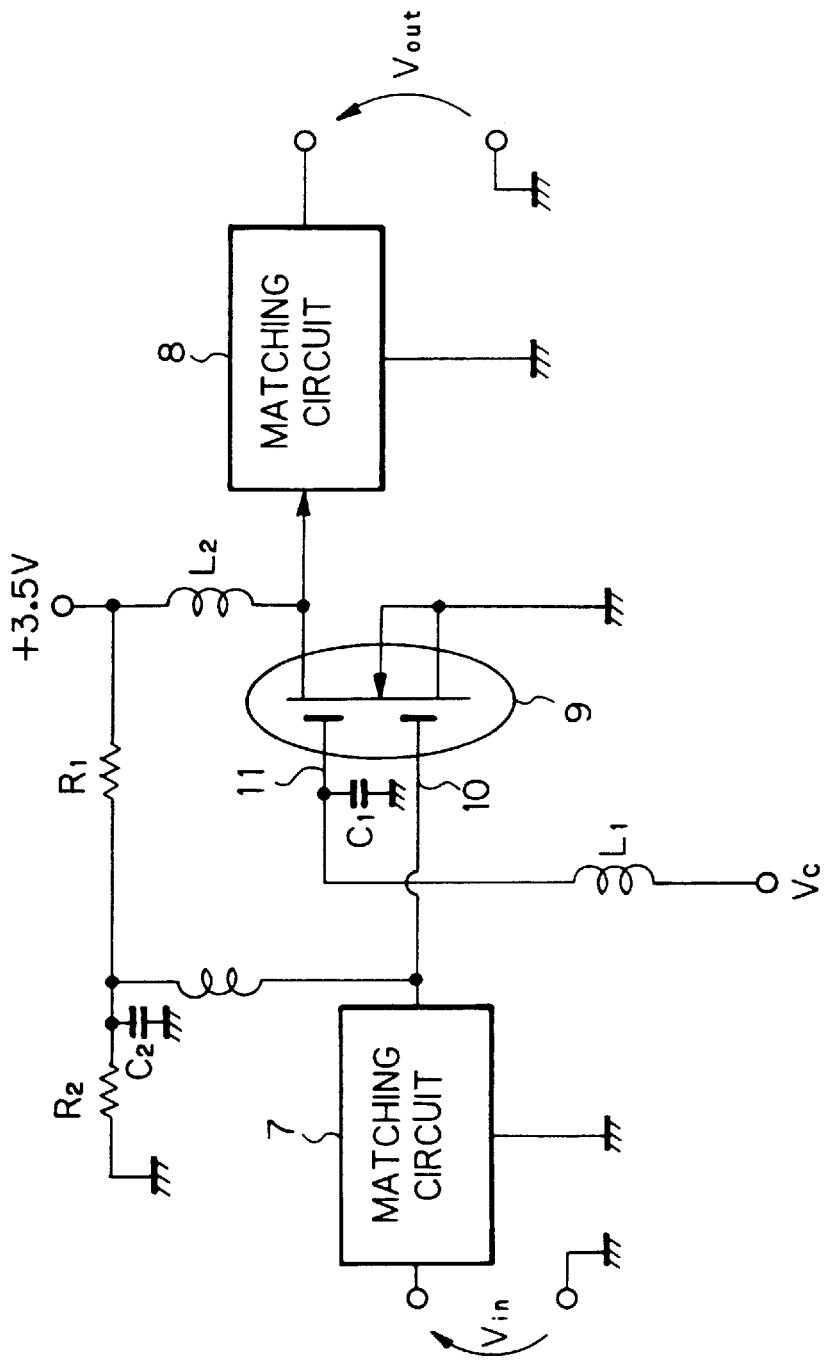
FIG. 1 is a block diagram schematically showing a conventional variable gain amplifier.
Figure 3:
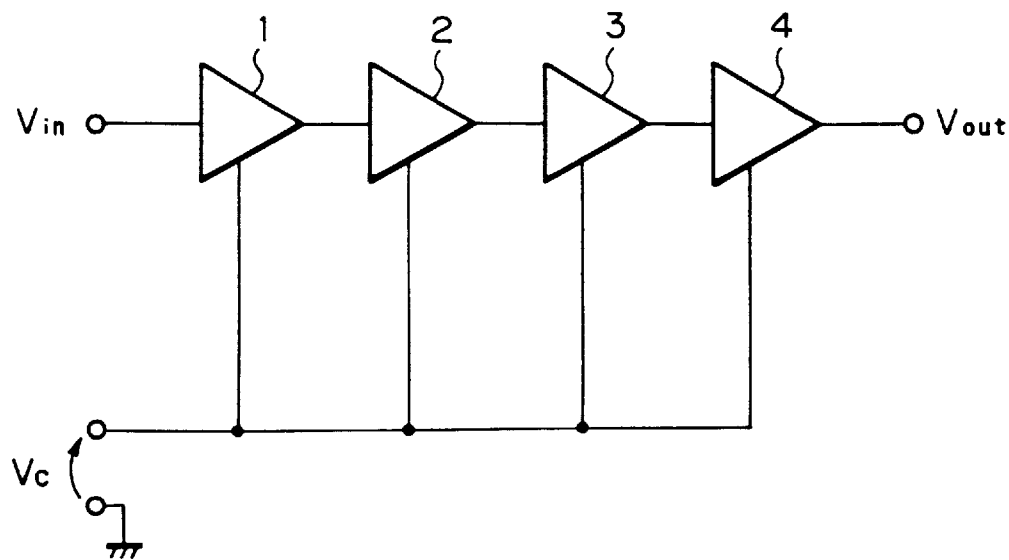
FIG. 3 shows a specific serial connection of amplifiers each having the configuration shown in FIG. 1.
Figure 4:
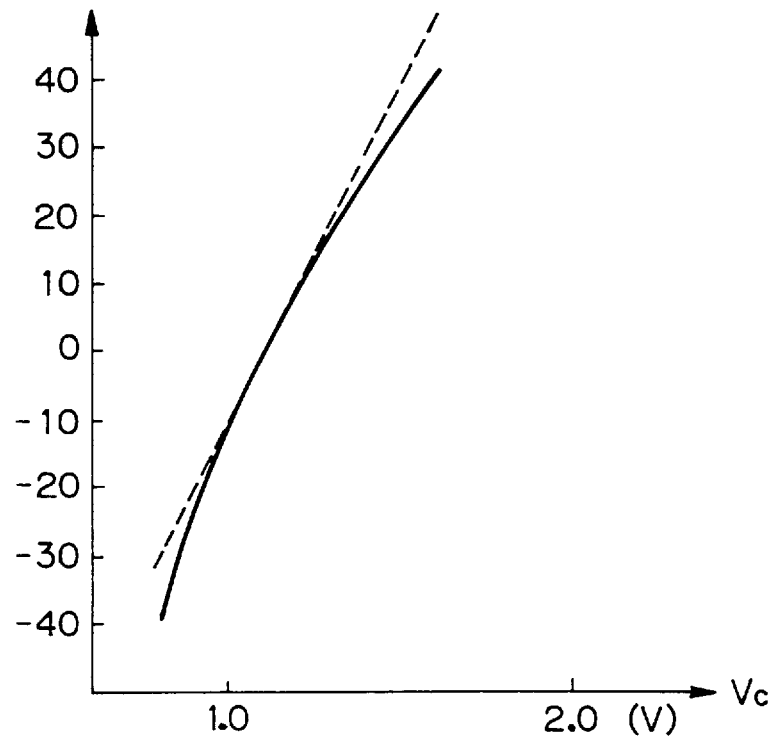
FIG. 4 is a graph showing a relation between the power gain and the control voltage particular to the serial connection shown in FIG. 3.

In light of the above, a plurality of amplifiers each having the configuration of FIG. 1 may be connected in series so as to broaden the variable range of the gain. FIG. 3 shows a serial connection of four amplifiers 1–4 by way of example. As shown, a control signal is fed from a single control terminal to all the amplifiers 1–4. Assume that a voltage Vc appearing on the control terminal is varied over a range of from 0.8 V to 1.6 V in which the gain of the amplifier shown in FIG. 1 varies relatively linearly from −10 dB to +10 dB. Then, as shown in FIG. 4, the gain is variable between −40 dB to +40 dB. This range is four times as broad as the range available with the amplifier of FIG. 4. However, the relation between the control voltage Vc and the gain is not linear; the four times broader range quadruples the deviation from linearity. Moreover, the control voltage is variable only between 0.8 V and 1.6 V and is apt to deviate easily due to, e.g., the deviation of a circuit constant.

Figure 5:
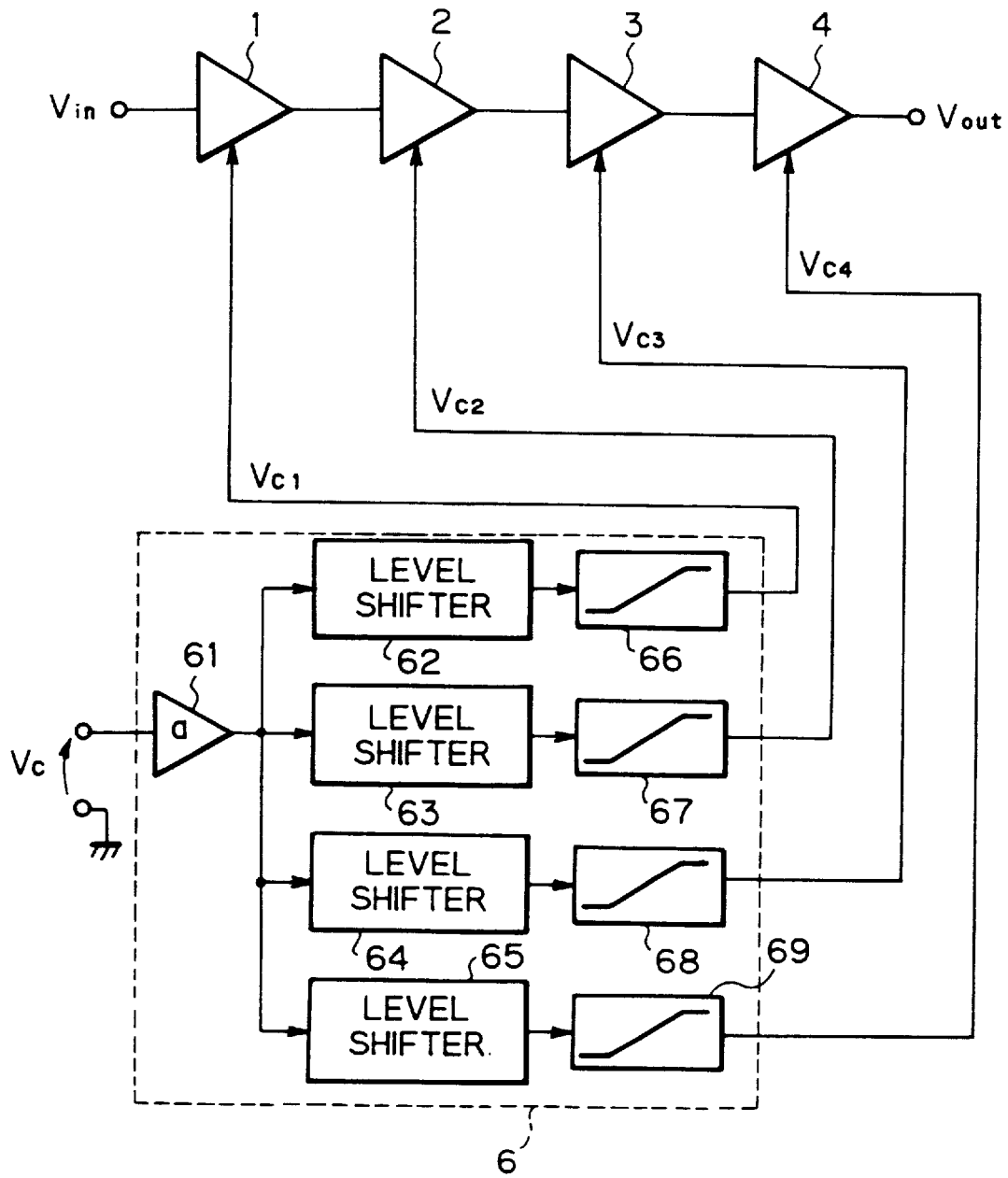
FIG. 5 is a block diagram schematically showing a variable gain amplifying device embodying the present invention.

Referring to FIG. 5, a variable gain amplifying device embodying the present invention will be described. As shown, the amplifying device has a serial connection of four variable gain amplifiers 1–4. The amplifiers 1–4 may each be provided with the configuration shown in FIG. 1. The ratio of an output signal Vout to an input signal Vin, i.e., the gain (dB) of the device is represented by the sum of the gains (dB) of the amplifiers 1–4.

A control signal generator 6 is made up of a DC amplifier 61, level shifters 62, 63, 64 and 65, and voltage limiters 66, 67, 68 and 69. A control voltage Vc is input to the control signal generator 6 and amplified or attenuated by the DC amplifier 61. Let the gain of the DC amplifier 61 be zero dB (one time) for simplicity. The output voltage of the DC amplifier 61 is fed to the level shifters 62–65 each being assigned to the respective amplifier 1–4. The level shifters 62–65 each shifts the input voltage by a particular DC voltage value. The shifted voltages output from the level shifters 62–65 are applied to the voltage limiters 66–69, respectively. The voltage limiters 66–69 limit the shifted voltages to a preselected DC voltage range. Control voltages Vc1–Vc4 output from the voltage limiters 66–69, respectively, are fed to the amplifiers 1–4, respectively.

Figure 6:
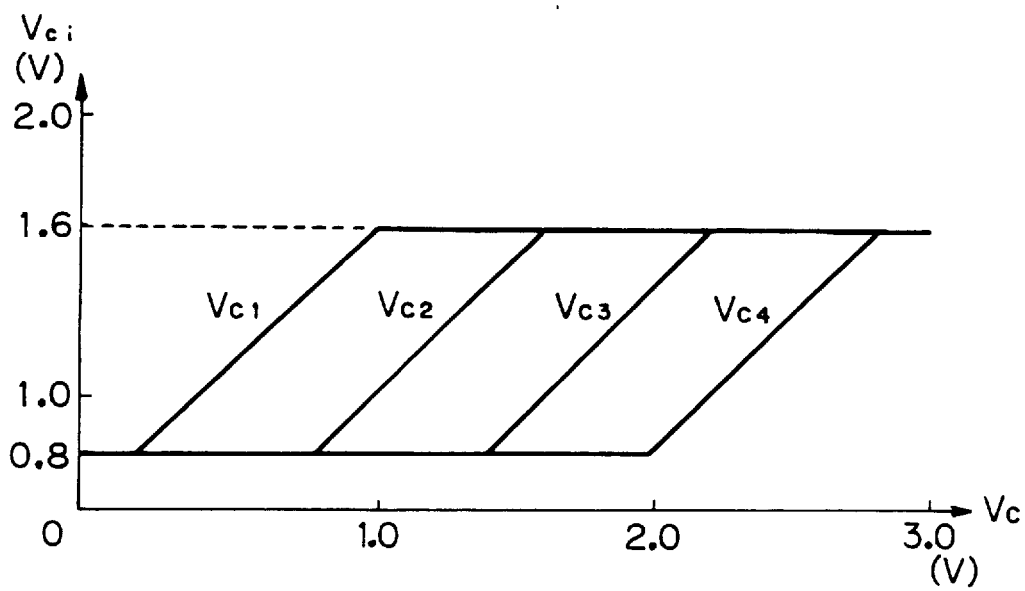
FIG. 6 is a graph representative of the operation of the illustrative embodiment.

FIG. 6 shows a relation between the input control voltage Vc and the control voltages Vc1–Vc4 output from the voltage limiters 66–69. As shown, the level shifters 62–65 respectively shift the input control voltage Vc by +0.6 V, 0 V, –0.6 V and –1.2 V, i.e., by 0.6 V each. Further, the voltage limiters 66–69 limit the highest voltage to 1.6 V and the lowest voltage to 0.8 V.

Figure 7:
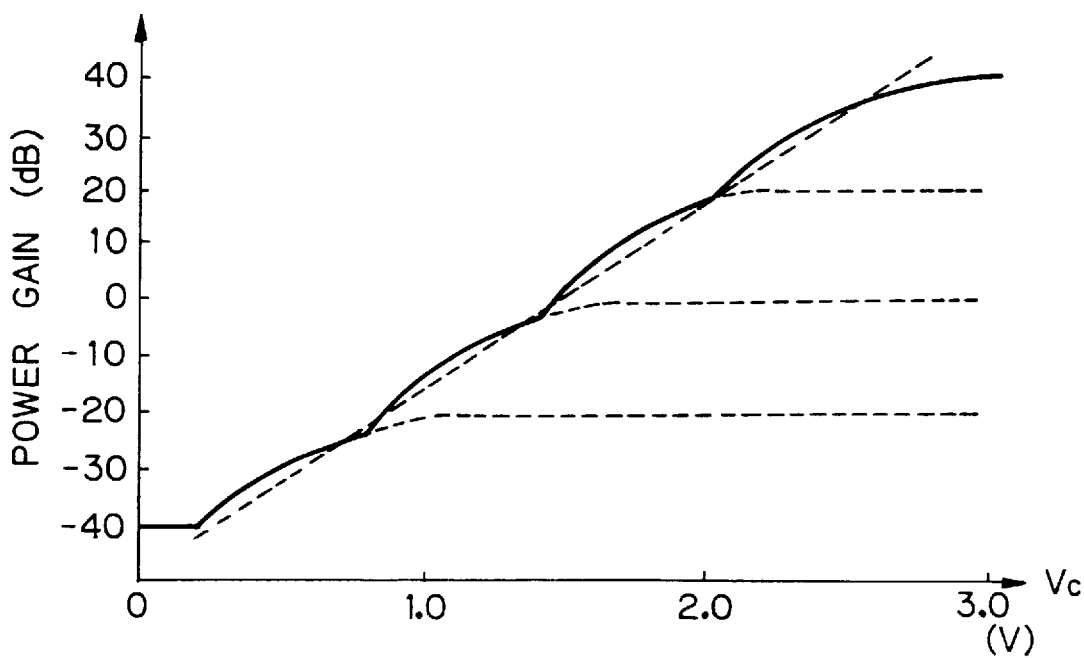
FIG. 7 is a graph showing a relation between the power gain and the control voltage achievable with the embodiment.

As shown in FIG. 7, the above control voltages Vc1–Vc4 sequentially activate the amplifiers 1–4 one by one with the increase in input control voltage Vc. As a result, the gain of device varies stepwise. This insures a more linear gain-to-control voltage characteristic over a broad range of control voltage, i.e., between 0.2 V and 2.8 V.

In summary, it will be seen that the present invention provides a variable gain amplifying device having a more linear gain-to-control voltage characteristic than the conventional device. In addition, because the device of the present invention broadens the range of control voltage without aggravating the deviation of the gain, its gain-to-control voltage characteristic is more stable than the characteristic of the conventional device.

Various modifications will become possible for those skilled in the art after receiving the teachings of the present disclosure without departing from the scope thereof.

What is claimed is:

1. A variable gain amplifying device comprising:

M (M=2, 3, 4, . . . ) variable gain amplifiers connected in series; and control signal generating means for generating a DC amplified first control signal, for shifting said DC amplified first control signal by M predetermined values to produce shifted voltages, and for limiting said shifted voltages to produce limited voltages to thereby output M second control signals;

wherein said control signal generating means is coupled to said M variable gain amplifiers and wherein said M second control signals control gains of said M variable gain amplifiers, respectively.

2. A device as claimed in claim 1, wherein said control signal generating means comprises:

amplifying means for generating said DC amplified first control signal;

M level shifting means each for shifting said DC amplified first control signal from said amplifying means by a particular value; and M voltage limiting means for respectively limiting voltage ranges of outputs of said M level shifting means; and wherein M outputs of said M voltage limiting means respectively control said M variable gain amplifiers.

3. A variable gain amplifying device comprising:

M (where M is an integer greater than 1) variable gain amplifiers connected in series;

a control signal generator generating a first control signal;

M voltage level shifters coupled to said control signal generator, each of said M voltage level shifters generating a shifted control signal by shifting said first control signal generated by said control signal generator by a predetermined amount; and M voltage limiters respectively coupled to said M voltage level shifters and respectively coupled to said M variable gain amplifiers, each of said M voltage limiters generating a limited shifted control signal by limiting voltage ranges of said M shifted control signals generated by said M voltage level shifters, wherein said M variable gain amplifiers are responsive to said M shifted limited control signals generated by said M voltage limiters.

4. A variable gain amplifying device as recited in claim 3 wherein said control signal generator is a DC amplifier generating said first control signal as a DC amplified first control signal.

5. A process for controlling M (where M is an integer greater than 1) variable gain amplifiers connected in series comprising the steps of:

generating a first control signal;

shifting said first control signal by M predetermined amounts, thereby generating M shifted control signals;

limiting voltage ranges of said M shifted control signals, thereby generating M limited shifted control signals; and controlling said M variable gain amplifiers in response to said M limited shifted control signals.

6. A process as recited in claim 5 wherein said first control signal is generated as a DC amplified first control signal.

\* \* \* \* \*